US010124529B2

(12) United States Patent
Haase et al.

(10) Patent No.: US 10,124,529 B2
(45) Date of Patent: Nov. 13, 2018

(54) IMPRINT LITHOGRAPHY TEMPLATE AND METHOD FOR ZERO-GAP IMPRINTING

(71) Applicant: Canon Nanotechnologies, Inc., Austin, TX (US)

(72) Inventors: Gaddi S. Haase, Albuquerque, NM (US); Kosta S. Selinidis, Austin, TX (US); Zhengmao Ye, Austin, TX (US)

(73) Assignee: Canon Nanotechnologies, Inc., Austin, TX (US)

( * ) Notice: Subject to any disclaimer, the term of this patent is extended or adjusted under 35 U.S.C. 154(b) by 694 days.

(21) Appl. No.: 14/565,507

(22) Filed: Dec. 10, 2014

(65) Prior Publication Data

US 2015/0158240 A1 Jun. 11, 2015

Related U.S. Application Data

(60) Provisional application No. 61/913,961, filed on Dec. 10, 2013.

(51) Int. Cl.
*B29C 59/02* (2006.01)
*G03F 7/00* (2006.01)
*B29L 7/00* (2006.01)

(52) U.S. Cl.
CPC .......... *B29C 59/022* (2013.01); *G03F 7/0002* (2013.01); *B29L 2007/001* (2013.01)

(58) Field of Classification Search
CPC .............. B29C 59/022; G03F 7/0002; B29L 2007/001; B82Y 10/00; B82Y 40/00
USPC .................. 264/293, 219; 425/385, 174.4
See application file for complete search history.

(56) References Cited

U.S. PATENT DOCUMENTS

| | | |
|---|---|---|
| 6,873,087 B1 | 3/2005 | Choi et al. |
| 6,932,934 B2 | 8/2005 | Choi et al. |
| 6,936,194 B2 | 8/2005 | Watts |
| 7,077,992 B2 | 7/2006 | Sreenivasan et al. |
| 7,157,036 B2 | 1/2007 | Choi et al. |
| 7,179,396 B2 | 2/2007 | Sreenivasan |
| 7,396,475 B2 | 7/2008 | Sreenivasan |
| 8,349,241 B2 | 1/2013 | Sreenivasan et al. |
| 8,850,980 B2 * | 10/2014 | Sreenivasan ........... B82Y 10/00 101/483 |
| 2004/0065252 A1 | 4/2004 | Sreenivasan et al. |

(Continued)

FOREIGN PATENT DOCUMENTS

WO  WO 2007/117523 A2  10/2007

*Primary Examiner* — Nahida Sultana
(74) *Attorney, Agent, or Firm* — Cameron A. King

(57) ABSTRACT

Imprint lithography templates having leading and trailing edge borders are provided that achieve zero-gap imprinting between adjacent fields with full-feature height features provided in the pattern exclusion zones (PEZ) located between such fields. The leading edge borders include dummy features, e.g., elongated features directionally oriented parallel to the mesa edge, while the trailing edge border includes a recess extending to the mesa edges. When used in a step-and-repeat process, the trailing edge border overlaps edge portions of an adjacent imprinted field that were previously patterned by the leading edge border of the template, producing full-feature height features in the pattern exclusion zones between such fields, and avoiding gaps or open areas between such fields that otherwise lead to non-uniformity of downstream processes such as etch processes and CMP.

11 Claims, 5 Drawing Sheets

(56) References Cited

U.S. PATENT DOCUMENTS

| | | | |
|---|---|---|---|
| 2004/0192041 A1* | 9/2004 | Jeong | B82Y 10/00 438/689 |
| 2005/0187339 A1 | 8/2005 | Xu et al. | |
| 2006/0113697 A1* | 6/2006 | Sreenivasan | B29C 43/003 264/138 |
| 2006/0266916 A1* | 11/2006 | Miller | B82Y 10/00 249/134 |
| 2007/0026542 A1* | 2/2007 | Sreenivasan | B82Y 10/00 438/10 |
| 2007/0054097 A1* | 3/2007 | Suehira | B29C 35/0894 428/195.1 |
| 2007/0176320 A1* | 8/2007 | Nakamura | B82Y 10/00 264/219 |
| 2008/0214010 A1 | 9/2008 | Yoneda et al. | |
| 2008/0237936 A1 | 10/2008 | Park et al. | |
| 2009/0148619 A1* | 6/2009 | LaBrake | B82Y 10/00 427/511 |
| 2009/0174115 A1* | 7/2009 | Loopstra | B41M 3/003 264/293 |
| 2009/0224436 A1 | 9/2009 | Mikami et al. | |
| 2009/0250840 A1* | 10/2009 | Selinidis | B82Y 10/00 264/293 |
| 2011/0018168 A1 | 1/2011 | Wuister et al. | |
| 2011/0062623 A1* | 3/2011 | Saito | B82Y 10/00 264/219 |
| 2012/0200005 A1* | 8/2012 | Sato | B82Y 10/00 264/293 |
| 2014/0061969 A1* | 3/2014 | Okamoto | B29C 59/002 264/293 |
| 2015/0217504 A1* | 8/2015 | Nakagawa | B29C 33/3842 425/385 |
| 2015/0360412 A1* | 12/2015 | Isobayashi | G03F 7/0002 264/293 |
| 2016/0147143 A1* | 5/2016 | Ito | G03F 7/0002 264/447 |
| 2017/0351171 A1* | 12/2017 | Thompson | G03F 7/0002 |

\* cited by examiner

IMPRINT LITHOGRAPHY TEMPLATE AND METHOD FOR ZERO-GAP IMPRINTING

CROSS-REFERENCE TO RELATED APPLICATION

This application claims the benefit under 35 U.S.C. § 119(e)(1) of U.S. Provisional Application No. 61/913,961 filed Dec. 10, 2013; which is hereby incorporated by reference herein in its entirety.

BACKGROUND INFORMATION

Nano-fabrication includes the fabrication of very small structures that have features on the order of 100 nanometers or smaller. One application in which nano-fabrication has had a sizeable impact is in the processing of integrated circuits. The semiconductor processing industry continues to strive for larger production yields while increasing the circuits per unit area formed on a substrate; therefore nano-fabrication becomes increasingly important. Nano-fabrication provides greater process control while allowing continued reduction of the minimum feature dimensions of the structures formed. Other areas of development in which nano-fabrication has been employed include biotechnology, optical technology, mechanical systems, and the like.

An exemplary nano-fabrication technique in use today is commonly referred to as imprint lithography. Imprint lithography is useful in a variety of applications including, for example, fabricating layers of integrated devices such as CMOS logic, microprocessors, NAND Flash memory, NOR Flash memory, DRAM memory, or other memory devices such as MRAM, 3D cross-point memory, Re-RAM, Fe-RAM, STT-RAM, and the like. Imprint lithography is also useful in fabricating layers in a thin film head device for hard disks. Imprint lithography can also be used to fabricate patterned media for hard disk drives, optical devices such as polarizers for displays, photonic crystal structures, light trapping structures and filters for photovoltaic devices, nanostructures for battery electrodes, quantum dot structures for enhanced photonic and photovoltaic devices, biomedical devices, sensors, and in the fabrication of controlled nano-particles. Controlled nano-particles can be used to fabricate crystalline semiconducting materials, or as polymer-based drug carriers, among other uses. Exemplary imprint lithography processes are described in detail in numerous publications, such as U.S. Pat. No. 8,349,241, U.S. Patent Publication No. 2004/0065252, and U.S. Pat. No. 6,936,194, all of which are hereby incorporated by reference herein.

An imprint lithography technique disclosed in each of the aforementioned U.S. patent publication and patents includes formation of a relief pattern in a formable (polymerizable) layer and transferring a pattern corresponding to the relief pattern into an underlying substrate. The substrate may be coupled to a motion stage to obtain a desired positioning to facilitate the patterning process. The patterning process uses a template spaced apart from the substrate and a formable liquid applied between the template and the substrate. The formable liquid is solidified to form a rigid layer that has a pattern conforming to a shape of the surface of the template that contacts the formable liquid. After solidification, the template is separated from the rigid layer such that the template and the substrate are spaced apart. The substrate and the solidified layer are then subjected to additional processes to transfer a relief image into the substrate that corresponds to the pattern in the solidified layer.

BRIEF DESCRIPTION OF DRAWINGS

So that features and advantages of the present invention can be understood in detail, a more particular description of embodiments of the invention may be had by reference to the embodiments illustrated in the appended drawings. It is to be noted, however, that the appended drawings only illustrate typical embodiments of the invention, and are therefore not to be considered limiting of its scope, for the invention may admit to other equally effective embodiments.

DETAILED DESCRIPTION

Figure 1:
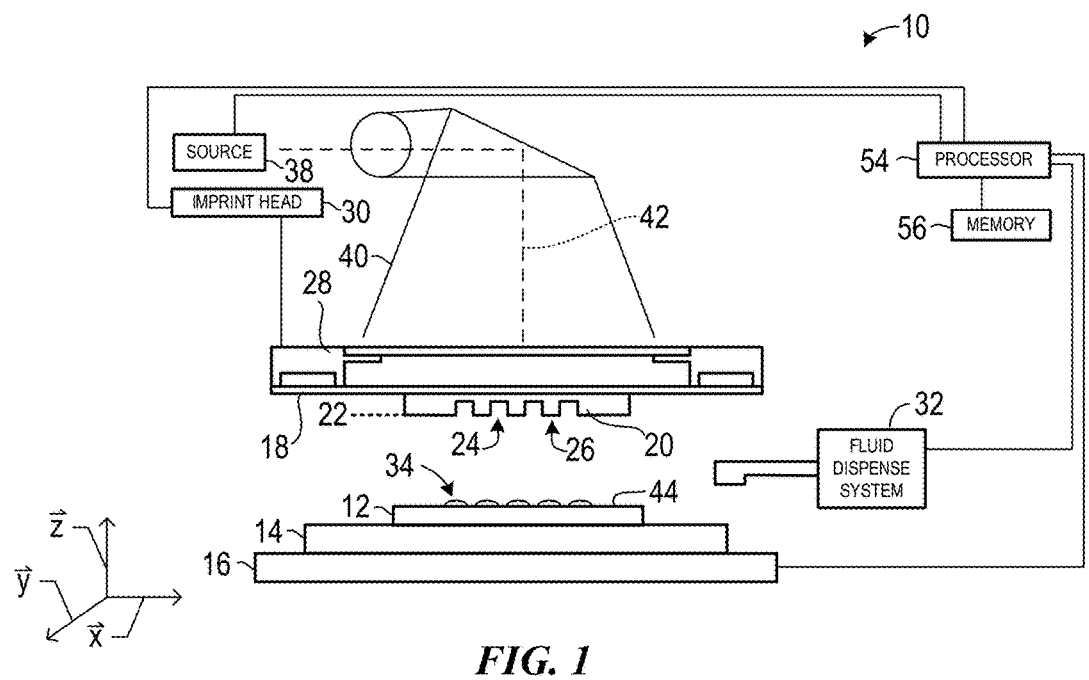
FIG. 1 illustrates a simplified side view of a lithographic system having a template and a mold spaced apart from a substrate.

Referring to the figures, and particularly to FIG. 1, illustrated therein is a lithographic system 10 used to form a relief pattern on substrate 12. Substrate 12 may be coupled to substrate chuck 14. As illustrated, substrate chuck 14 is a vacuum chuck. Substrate chuck 14, however, may be any chuck including, but not limited to, vacuum, pin-type, groove-type, electrostatic, electromagnetic, and/or the like. Exemplary chucks are described in U.S. Pat. No. 6,873,087, which is hereby incorporated by reference herein.

Substrate 12 and substrate chuck 14 may be further supported by stage 16. Stage 16 may provide translational and/or rotational motion along the x, y, and z-axes. Stage 16, substrate 12, and substrate chuck 14 may also be positioned on a base (not shown).

Spaced-apart from substrate 12 is template 18. Template 18 may include a body having a first side and a second side with one side having a mesa 20 extending therefrom towards substrate 12. Mesa 20 having a patterning surface 22 thereon. Further, mesa 20 may be referred to as mold 20. Alternatively, template 18 may be formed without mesa 20.

Template 18 and/or mold 20 may be formed from such materials including, but not limited to, fused-silica, quartz, silicon, organic polymers, siloxane polymers, borosilicate glass, fluorocarbon polymers, metal, hardened sapphire, and/or the like. As illustrated, patterning surface 22 comprises features defined by a plurality of spaced-apart recesses 24 and/or protrusions 26, though embodiments of the present invention are not limited to such configurations (e.g., planar surface). Patterning surface 22 may define any original pattern that forms the basis of a pattern to be formed on substrate 12.

Template 18 may be coupled to chuck 28. Chuck 28 may be configured as, but not limited to, vacuum, pin-type, groove-type, electrostatic, electromagnetic, and/or other similar chuck types. Exemplary chucks are further described in U.S. Pat. No. 6,873,087, which is hereby incorporated by reference herein. Further, chuck 28 may be coupled to imprint head 30 such that chuck 28 and/or imprint head 30 may be configured to facilitate movement of template 18.

System 10 may further comprise a fluid dispense system 32. Fluid dispense system 32 may be used to deposit formable material 34 (e.g., polymerizable material) on substrate 12. Formable material 34 may be positioned upon substrate 12 using techniques, such as, drop dispense, spin-coating, dip coating, chemical vapor deposition (CVD), physical vapor deposition (PVD), thin film deposition, thick film deposition, and/or the like. Formable material 34 may be disposed upon substrate 12 before and/or after a desired volume is defined between mold 22 and substrate 12 depending on design considerations. Formable material 34 may be functional nano-particles having use within the bio-domain, solar cell industry, battery industry, and/or other industries requiring a functional nano-particle. For example, formable material 34 may comprise a monomer mixture as described in U.S. Pat. No. 7,157,036 and U.S. Patent Publication No. 2005/0187339, both of which are herein incorporated by reference. Alternatively, formable material 34 may include, but is not limited to, biomaterials (e.g., PEG), solar cell materials (e.g., N-type, P-type materials), and/or the like.

Figure 2:
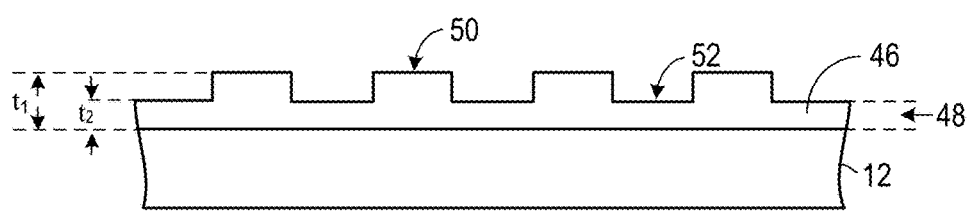
FIG. 2 illustrates a simplified view of the substrate illustrated in FIG. 1, having a patterned layer thereon.

Referring to FIGS. 1 and 2, system 10 may further comprise energy source 38 coupled to direct energy 40 along path 42. Imprint head 30 and stage 16 may be configured to position template 18 and substrate 12 in superimposition with path 42. System 10 may be regulated by processor 54 in communication with stage 16, imprint head 30, fluid dispense system 32, and/or source 38, and may operate on a computer readable program stored in memory 56.

Either imprint head 30, stage 16, or both vary a distance between mold 20 and substrate 12 to define a desired volume therebetween that is filled by formable material 34. For example, imprint head 30 may apply a force to template 18 such that mold 20 contacts formable material 34. After the desired volume is filled with formable material 34, source 38 produces energy 40, e.g., ultraviolet radiation, causing formable material 34 to solidify and/or cross-link conforming to a shape of surface 44 of substrate 12 and patterning surface 22, defining patterned layer 46 on substrate 12. Patterned layer 46 may comprise a residual layer 48 and a plurality of features shown as protrusions 50 and recessions 52, with protrusions 50 having a thickness $t_1$ and residual layer having a thickness $t_2$.

The above-mentioned system and process may be further employed in imprint lithography processes and systems referred to in U.S. Pat. No. 6,932,934, U.S. Pat. No. 7,077,992, U.S. Pat. No. 7,179,396, and U.S. Pat. No. 7,396,475, all of which are hereby incorporated by reference in their entirety.

Figure 3:
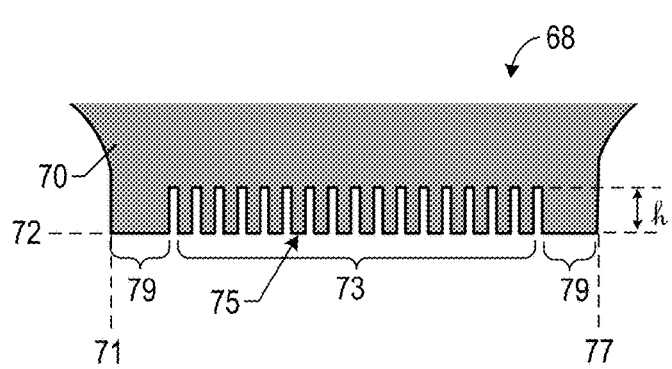
FIG. 3 illustrates a simplified view of an imprint lithography template mesa having a patterning surface.

Such processes further include so-called step-and-repeat processes which can be employed, e.g., in patterning multiple fields over a substrate, such as a semiconductor wafer. Typical step-and-repeat processes are described e.g. in U.S. Pat. No. 7,077,992, incorporated herein by reference in its entirety. In order to confine the polymerizable material (also referred to herein as resist or resist material) within the field being imprinted, imprint templates are often configured with a border or edge that contains no relief features. Referring to FIG. 3, template 68 is exemplary of such an imprint template and includes mesa 70 extending from template body (not shown) with patterning surface 72 located thereon. Patterning surface 72 includes patterning area 73 containing relief features 75 (e.g., protrusions and recessions) having a height (or depth) h. Patterning area 73 is surrounded by border 79 which contains no relief features. Border 79 extends from the edge of patterning area 73 to mesa edges 71 or 77. When imprinting a field, the provision of border 79 aids in confining the resist within the imprinted field and preventing extrusion of the resist beyond the field. That is, if the patterned area extended fully to the mesa edge, then the fluid resist could freely flow beyond the mesa edge as the resist fluid fills the patterned area features. By surrounding the patterned area with border 79, the fluid resist remains confined patterning area such that only a thin residual layer of resist fills the space between the border 79 and template during fluid fill. The result is that the imprinted field will contain a patterned layer having a thin residual layer boundary (or RLB) that surrounds the patterned features.

Figure 4A:
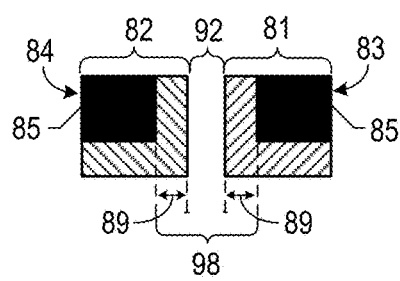
FIGS. 4A and 4B illustrate a simplified view of patterned layers imprinted on adjacent fields by the template of FIG. 3.
Figure 4B:
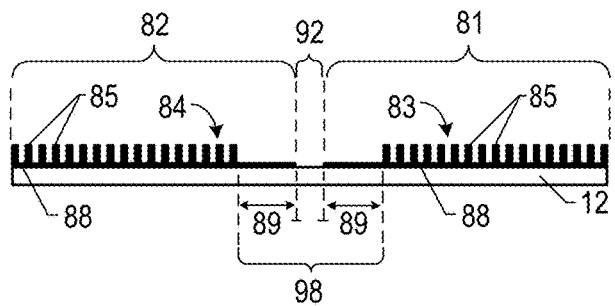
Figure 5A:
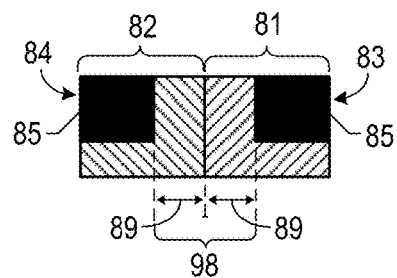
FIGS. 5A and 5B illustrate another simplified view of patterned layers imprinted on adjacent fields by the template of FIG. 3.
Figure 5B:
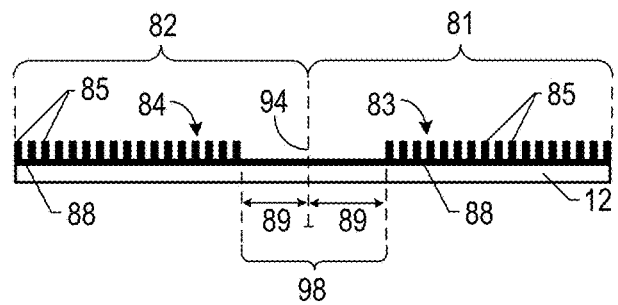
Figure 6A:
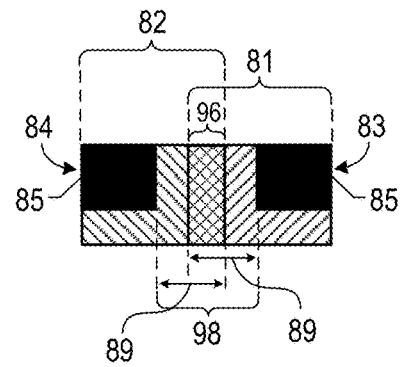
FIGS. 6A and 6B illustrate yet another simplified view of patterned layers imprinted on adjacent fields by the template of FIG. 3.
Figure 6B:
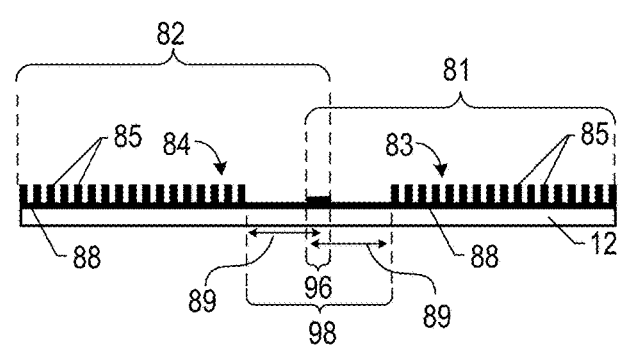

Referring to FIGS. 4A-4B, using template 68, adjacent patterned layers 83 and 84 have been formed onto adjacent fields 81 and 82, respectively, of substrate 12. As shown, patterned layers 83 and 84 include patterned features 85 (corresponding to template relief features 75) and residual layer boundaries 89 extending from the edge of the patterned feature area to the respective field edge. In this example, patterned layers 83 and 84 themselves are further separated by gap 92. Such gaps are often provided to, for example, prevent interference between adjacent imprinted fields, accommodate tolerance variations in template mesa etching, and/or otherwise guard against damage to existing prior patterned features when performing the subsequent adjacent field imprinting. Typical gap sizes can range up to 150 microns. Alternatively, imprints have been attempted in which the adjacent fields are abutted, as shown in FIGS. 5A and 5B, or even slightly overlapped, as shown in FIGS. 6A and 6B. In each of these situations, the same residual layer boundaries 89 are provided and are of sufficient dimension as to likewise accommodate mesa etch variability, and prevent interference and feature damage. In each of these cases, then, pattern exclusion zone (or PEZ) 98 is established between patterned feature areas 85 of adjacent fields 81 and 82.

However, large pattern exclusion zones (PEZ) and/or gaps between patterned features on adjacent fields become problematic, particularly in the semiconductor industry, as they create "open areas" across otherwise fully patterned wafers. Such open areas on the wafer, even if only a few microns, lead to downstream wafer processing problems. This is because when the patterned wafer is exposed to etch agents, these open areas having only a thin residual layer boundary (or in some cases gaps having no residual layer at all) can detrimentally expose the underlying substrate to the etching agents, leading to lack of uniformity in later wafer CMP and etch processes. It is desirable then that adjacent fields be imprinted without any gaps or open areas between fields.

Figure 7A:
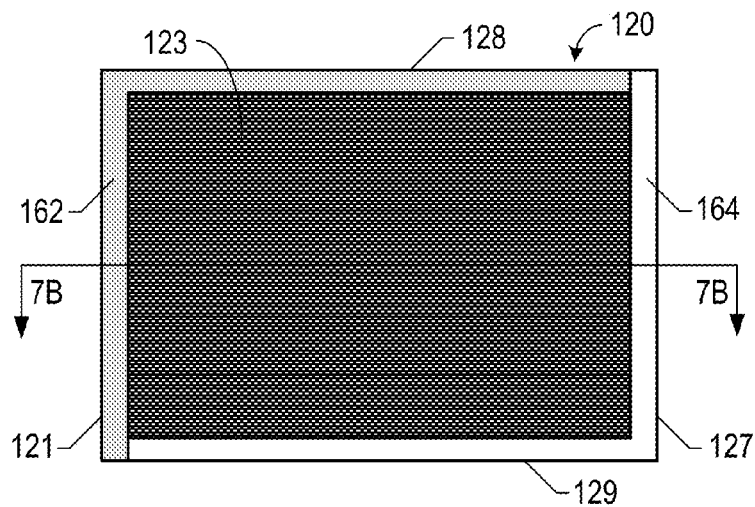
FIG. 7A illustrates a simplified top down view of an imprint lithography template having leading and trailing edge borders according to an embodiment of the invention.
Figure 7B:
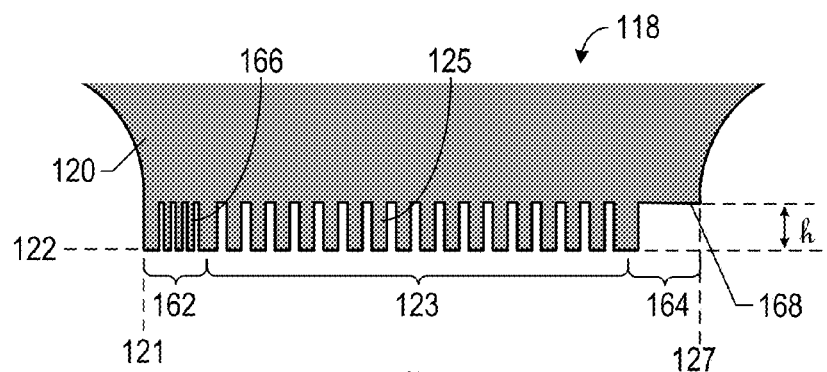
FIG. 7B illustrates a cross-sectional view of the imprint lithography template of FIG. 7A taken along the plane designated by line 7B-7B.
Figure 8A:
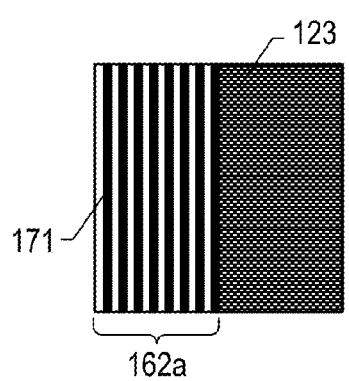
FIGS. 8A and 8B illustrate expanded top down views of leading edge border sections of an imprint lithography template according to another embodiment of the invention.
Figure 8B:
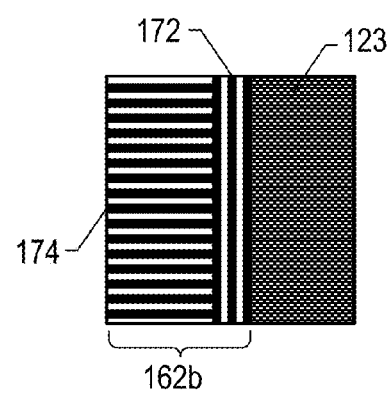
Figure 11A:
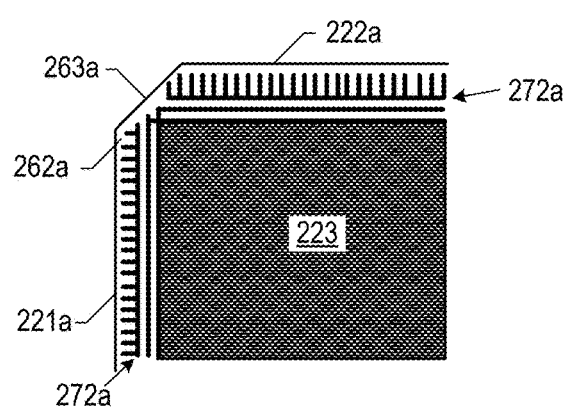
FIGS. 11A-11C illustrate expanded top down views of leading edge border sections with chamfered corners according to further embodiments of the invention.
Figure 11B:
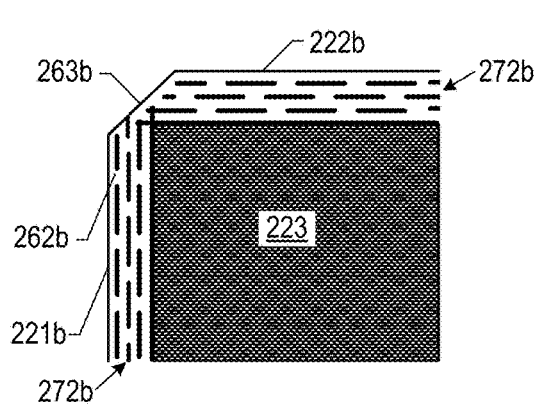
Figure 11C:
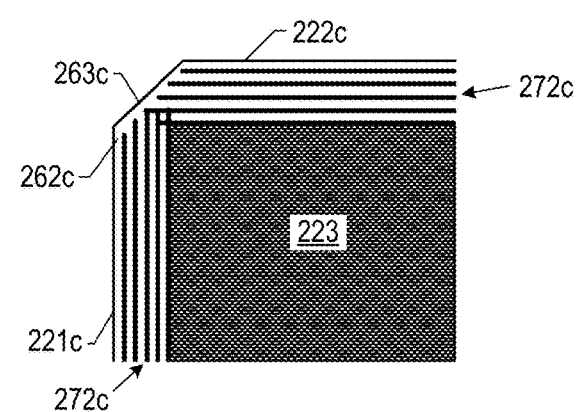

The invention provided herein makes it possible to imprint adjacent fields without gaps and/or open spaces between the fields by providing for articles, systems and methods that provide for zero-gap imprinting with full-feature height features provided in the pattern exclusion zones (PEZ). With reference to FIGS. 7A and 7B, template 118 having mesa 120 is provided. Mesa 120 includes patterning area 123 containing relief features 125 and surrounded by leading edge border 162 and trailing edge border 164. Leading edge border 162 extends along adjacent mesa edges 121, 128 with trailing edge border 164 extending along opposing adjacent mesa edges 127, 129. As is further detailed herein, leading edge border 162 is patterned to include dummy features 166, while trailing edge border 164 includes recess 168 that extends to mesa edges 127, 129. Dummy features 166 have the same height h as pattern features 125 and recess 168 is of a depth that corresponds to this same height h. Template 118 can be used in a step and repeat process, i.e., "stepped" across the wafer, in such fashion that the trailing edge border 164 overlaps portions of a prior imprinted field patterned by leading edge border 162, as will be further detailed. Dummy features 166 are preferably any elongated, directionally oriented features in which at least a subset of the features are oriented parallel to the mesa edge. FIG. 8A depicts an example of such features, with edge border 162a including gratings 171 that are oriented parallel to the mesa edge. FIG. 8B depicts another example, where edge border 162b likewise includes gratings 172 positioned at the edge of patterning area 123 and are oriented parallel to the mesa edge combined with gratings 174 that are orthogonal to gratings 172 and that extend from gratings 172 to the mesa edge. Further examples of leading edge dummy patterns are depicted in FIGS. 11A-11C and as further described herein.

When template 118 is used in a step and repeat process, the directionally oriented dummy patterns 166 of leading edge border 162 will produce corresponding imprinted dummy features at an imprinted field edge, leading to a full feature height pattern at the field border. Furthermore, when trailing edge border 164 is then overlapped over such features during a subsequent imprint step at an adjacent field, at least a portion the imprinted dummy features will be oriented perpendicular to the direction of fluid flow or dispersion. As such they will create a barrier against extrusion of fluid past mesa edge 127 and intervening spaces between the features can also fill with any excess fluid to further guard against extrusion and accommodate localized variations in dispensed fluid volume at the imprinted field. Thus leading and trailing edge borders 162 and 164, working in combination, allow for the abutment of imprinted fields (i.e., imprinting with no gaps between fields) with full feature height dummy patterns formed at the field borders, while also avoiding undesirable imprint fluid extrusion beyond mesa edge 127 which risks creating defects.

Figure 9A:
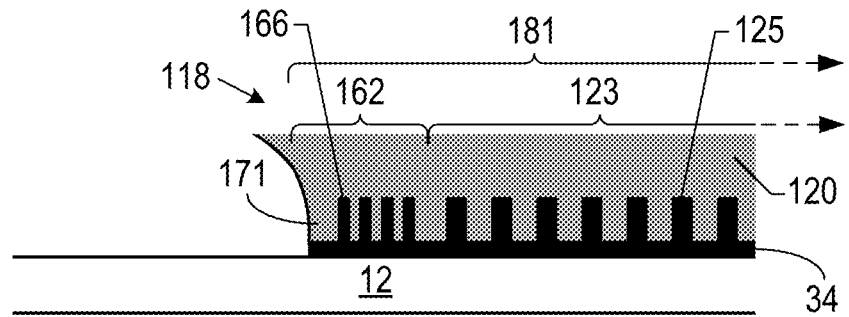
FIGS. 9A-9D illustrate a simplified view of a process for imprinting patterned layers on adjacent fields using the template of FIG. 7A.
Figure 9B:
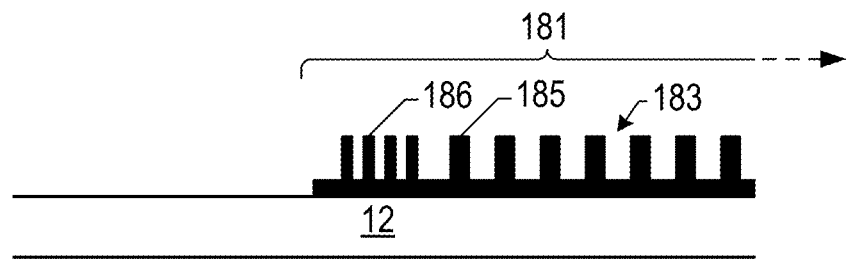
Figure 9C:
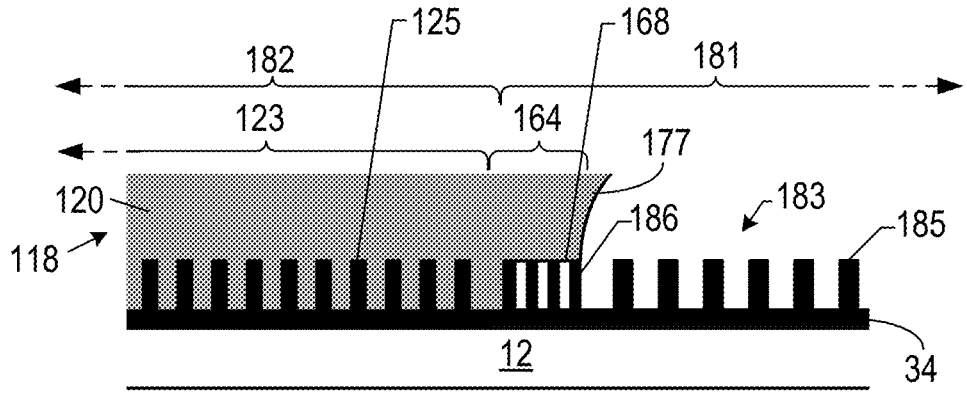
Figure 9D:
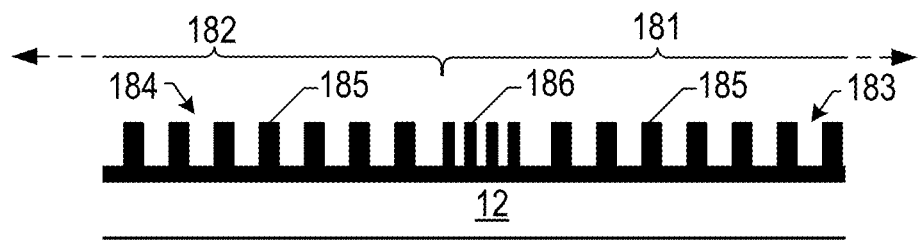

Turning to FIGS. 9A-9D, the above described process can be more readily understood. In FIG. 9A, template 118 with mesa 120 is positioned to imprint field 181, with imprint fluid 34 filling patterned feature area 123 and leading border 162 containing dummy features 166. The imprint fluid is then solidified to form patterned layer 183 at field 181 and template 118 removed, as shown in FIG. 9B, with patterned layer 183 containing pattern features 185 and dummy features 186 located at the edge of field 181. Adjacent field 182 is then imprinted using template 118, as shown in FIG. 9C. Here, the trailing edge bolder 164 containing recess 168 is positioned to overlap previously formed dummy features 186 of patterned layer 183 on field 181. Imprint fluid 34 fills pattern features 125 of patterned feature area 123, and is constrained from flowing or extruding into field 181 by the presence previously patterned dummy features 186. The imprint fluid is then solidified to form patterned layer 184 at field 182 and template 118 removed, as shown in FIG. 9D, with patterned layer 184 containing pattern features 185 and abutting patterned layer 183 of field 181. As can be seen, the result is no gap or open space between the abutted fields and further the dummy features 186 are of a similar or identical height to the patterned features 185, thus providing for essentially full height features between the patterned feature areas of adjacent imprint fields.

In the above described process of FIGS. 9A-9D, it can be appreciated that a step-and-repeat process using template 118 will typically proceed in stepwise fashion across a substrate (e.g. a wafer) in a right-to-left, bottom-to-top fashion. In this manner, each successive imprint will have trailing edge border 164 available to overlap dummy features 186 previously imprinted by leading edge border 162 on a previously imprinted adjacent field. As the initial row is imprinted, that trailing edge border overlap will occur along mesa edge 127 and as additional rows are imprinted such overlap will also occur along mesa edge 129. Trailing edge border 162 thus will always be overlapped over previously imprinted dummy features 186. It will be appreciated that partial fields can likewise be imprinted with template 118 such that the first full field imprint in any given row will allow for overlapping of previously imprinted dummy features 186 in an adjacent partial field.

In the above overlapping approach, however, a template having a standard rectangular mesa with 90 degree angled corners, such as template 118, will necessarily produce an additional layer buildup at the common adjacent corners or intersection of four adjacent imprinted fields. That is, when a second field is imprinted adjacent to a first imprinted field, there is an initial overlap as has been described, but then when additional adjacent imprints are performed, additional overlapping occurs at the intersection of the four adjacent fields, which creates an additional localized layer build up at such intersection (i.e., the third and fourth imprints create additional layer buildup at such common adjacent corners or intersection due to the 2× and 3× overlap conditions) leading in turn to potentially undesirable thickness variations at those locations.

Figure 10:
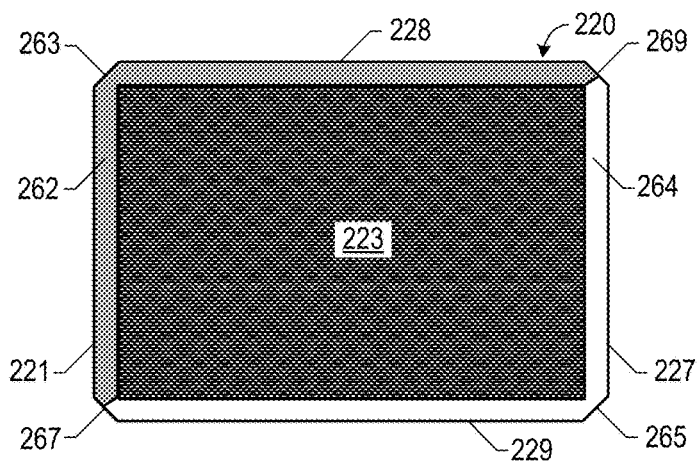
FIG. 10 illustrates an imprint lithography template having leading and trailing edge borders with chamfered corners according to another embodiment of the invention.

With reference to FIG. 10, mesa 220 is provided having an alternative configuration to a standard rectangular mesa. As can be seen, mesa 220 is chamfered at each corner. That is, leading edge 262 includes chamfer 263 where adjacent mesa edges 221 and 228 meet and trailing edge border 264 likewise included chamfer 265 where adjacent mesa edges 227 and 229 meet. In addition, the corners where the leading edge 262 and trailing edge 264 met are likewise chamfered, i.e., chamfer 267 where mesa edge 221 and 229 join and chamfer 269 where mesa edge 227 and 228 join. Further, as is likewise seen, at each of these locations the dummy patterned feature area of leading edge 262 and the recess feature area of trailing edge 264 meet along a line extending from the corresponding corner of patterned area 223 and bisecting chamfered corners 267 and 269. The angles of the chamfered corners themselves are approximately 45 degrees relative to the mesa sides. In use, it can be appreciated that this configuration will produce only a single overlap at common corner or intersection of four adjacent imprinted fields. For example, considering an initial field imprinted by a template with mesa 228 such that corner dummy features are printed in the field corner corresponding to chamfer 263, adjacently imprinted fields to the immediate left, above, and diagonal of such field will be overlapped by the recess of trailing edge 264 such that there is no additional imprinting of further dummy features in at that corner location. Thus the resultant imprinted layer at that corner location will have fundamentally the same height and conditions as the other overlapped areas.

FIGS. 11A-11C show further variations of a chamfered corner mesa in which the dummy pattern features of the leading edge are varied. As previously noted, such dummy pattern features comprise elongated, directionally oriented features where at least a portion of the features oriented parallel to the mesa edge. As also detailed, the design of such features blocks the resist fluid from extruding beyond the mesa edge while yielding a full feature height border, as well as functioning to retain additional resist fluid within such features. In this latter function, these features thereby act as "reservoirs" that can accommodate excess resist fluid and thus compensate for variations in resist fluid volume delivered to imprint fields. In other words, if the volume of resist fluid is over-supplied, the dummy features can, in essence, "absorb" such excess resist, further preventing resist extrusion or accumulation beyond or at the field edge. And if the volume of resist is under-supplied, then the dummy features will have already yielded the desired full feature height.

Turning to FIG. 11A, a mesa with leading edge 262a having chamfer 263a is provided. Leading edge 262a includes dummy feature pattern 272a having a first set of gratings positioned at the edge of patterning area 223 and oriented parallel to mesa edges 221a, 222a in combination with a second set of gratings orthogonal to the first set and extending toward mesa edges 221a, 222a, similar to that shown and described with respect to FIG. 8B. This produces a comb-like design, with the gratings parallel the mesa corresponding to the spine of the comb and blocking fluid extrusion beyond the mesa edge, while the gratings orthogonal to the mesa edge correspond to the tines of the comb and act, in effect, to draw excess fluid into the border region to more uniformly fill the border region. FIG. 11B shows a mesa with leading edge 262b having chamfer 263b. Here, dummy feature pattern 272b consists of a series of staggered bar features oriented parallel to mesa sides 221b and 222b respectively. Such a staggered bar design may have a critical feature dimension that is the same as or twice the neighboring device feature size. FIG. 11C shows a mesa with leading edge 262c having chamfer 263c. Dummy feature pattern 272c consists of gratings oriented parallel to mesa sides 221c and 222c respectively, similar to that shown and described with respect to FIG. 8A.

Further modifications and alternative embodiments of various aspects will be apparent to those skilled in the art in view of this description. Accordingly, this description is to be construed as illustrative only. It is to be understood that the forms shown and described herein are to be taken as examples of embodiments. Elements and materials may be substituted for those illustrated and described herein, parts and processes may be reversed, and certain features may be utilized independently, all as would be apparent to one skilled in the art after having the benefit of this description.

What is claimed is:

1. An imprint lithography template comprising:
   a body having a first side and a second side,
   a mesa extending from the first side of the body, the mesa having edges and further including a patterned area, the patterned area having pattern features having a height, the patterned area further surrounded by leading and trailing edge borders that extend from the patterned area to the mesa edges,
   wherein the leading edge border is formed along a first pair of adjacent mesa edges and includes dummy fill features of similar height as the patterned area features, and
   wherein the trailing edge border is formed along a second pair of adjacent mesa edges, opposite the first pair, and includes a single recess that extends and opens to the mesa edges, the recess having a depth that is similar to the height of the patterned area features.

2. The imprint lithography template of claim 1 wherein the mesa corners are chamfered.

3. The imprint lithography template of claim 1 wherein the dummy fill features are elongated and wherein at least a portion of such features are oriented parallel to the adjacent mesa edge.

4. The imprint lithography template of claim 3 wherein the dummy fill features further comprise gratings.

5. The imprint lithography template of claim 4 further comprising additional gratings oriented orthogonal to the mesa edge.

6. The imprint lithography template of claim 3 wherein the dummy fill features further comprise rows of staggered bars.

7. An imprint lithography template comprising:
   a body having a first side and a second side,
   a mesa extending from the first side of the body, the mesa having edges and further including a patterned area, the patterned area having pattern features having a height, the patterned area further surrounded by leading and trailing edge borders that extend from the patterned area to the mesa edges, and wherein the mesa corners are chamfered,
   wherein the leading edge border is formed along first pair of adjacent mesa edges and includes dummy fill features of similar height as the patterned area features, and
   wherein the trailing edge border is formed along a second pair of adjacent mesa edges, opposite the first pair, and includes a single recess that extends and opens to the mesa edges, the recess having a depth that is similar to the height of the patterned area features.

8. The imprint lithography template of claim 1 wherein the dummy fill features are elongated and wherein at least a portion of such features are oriented parallel to the adjacent mesa edge.

9. The imprint lithography template of claim 8 wherein the dummy fill features further comprise rows of staggered bars.

10. The imprint lithography template of claim 8 wherein the dummy fill features further comprise gratings.

11. The imprint lithography template of claim 10 further comprising additional gratings oriented orthogonal to the mesa edge.

* * * * *